(12) United States Patent
Iwane et al.

(10) Patent No.: US 8,139,133 B2
(45) Date of Patent: Mar. 20, 2012

(54) PHOTOELECTRIC CONVERSION DEVICE

(75) Inventors: Masaaki Iwane, Sagamihara (JP); Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 314 days.

(21) Appl. No.: 12/487,961

(22) Filed: Jun. 19, 2009

(65) Prior Publication Data

US 2010/0002117 A1 Jan. 7, 2010

(30) Foreign Application Priority Data

Jul. 1, 2008 (JP) ................................. 2008-172624

(51) Int. Cl.
- H04N 3/14 (2006.01)
- H04N 5/335 (2011.01)
- H01L 27/146 (2006.01)

(52) U.S. Cl. ........................................ 348/308; 257/443

(58) Field of Classification Search .................. None
See application file for complete search history.

(56) References Cited

U.S. PATENT DOCUMENTS

| | | | |
|---|---|---|---|
| 4,962,412 A | 10/1990 | Shinohara et al. | 357/30 |
| 5,008,206 A | 4/1991 | Shinohara et al. | 437/3 |
| 5,086,326 A | 2/1992 | Shinohara et al. | 357/30 |
| 5,146,339 A | 9/1992 | Shinohara et al. | 358/212 |
| 5,280,358 A | 1/1994 | Yushiya et al. | 358/213.17 |
| 5,955,753 A | 9/1999 | Takahashi | 257/292 |
| 5,981,932 A * | 11/1999 | Guerrieri et al. | 250/208.1 |
| 6,828,601 B2 | 12/2004 | Shinohara | 257/183.1 |
| 7,250,970 B2 | 7/2007 | Shinohara | 348/308 |
| 7,394,492 B2 | 7/2008 | Shinohara | 348/301 |
| 7,728,895 B2 * | 6/2010 | Tanaka et al. | 348/302 |
| 7,800,191 B2 * | 9/2010 | Ohtsuki et al. | 257/432 |
| 2005/0248675 A1 * | 11/2005 | Hashimoto et al. | 348/308 |
| 2005/0253945 A1 | 11/2005 | Shinohara | 348/300 |
| 2006/0114193 A1 | 6/2006 | Kwak et al. | 345/76 |
| 2007/0091190 A1 * | 4/2007 | Iwabuchi et al. | 348/294 |
| 2008/0029787 A1 | 2/2008 | Watanabe et al. | 257/233 |
| 2008/0252764 A1 | 10/2008 | Shinohara | 348/308 |
| 2009/0200449 A1 | 8/2009 | Iwata et al. | 250/206 |
| 2009/0231478 A1 | 9/2009 | Shinohara | 348/300 |

FOREIGN PATENT DOCUMENTS

JP 09-046596 A 2/1997

* cited by examiner

*Primary Examiner* — Albert Cutler
(74) *Attorney, Agent, or Firm* — Fitzpatrick, Cella, Harper & Scinto

(57) ABSTRACT

In a photoelectric conversion device, a first metal wiring layer and a second metal wiring layer are arranged on a semiconductor substrate that includes a pixel region where a plurality of pixels are arrayed in a matrix, each pixel including at least a photoelectric conversion portion and an amplification transistor. The second metal wiring layer includes power supply lines each configured to supply a power supply voltage to the amplification transistors of at least two pixel columns, and the amplification transistor of a pixel column having no power supply line receives the power supply voltage from the power supply line via the first metal wiring layer.

6 Claims, 16 Drawing Sheets

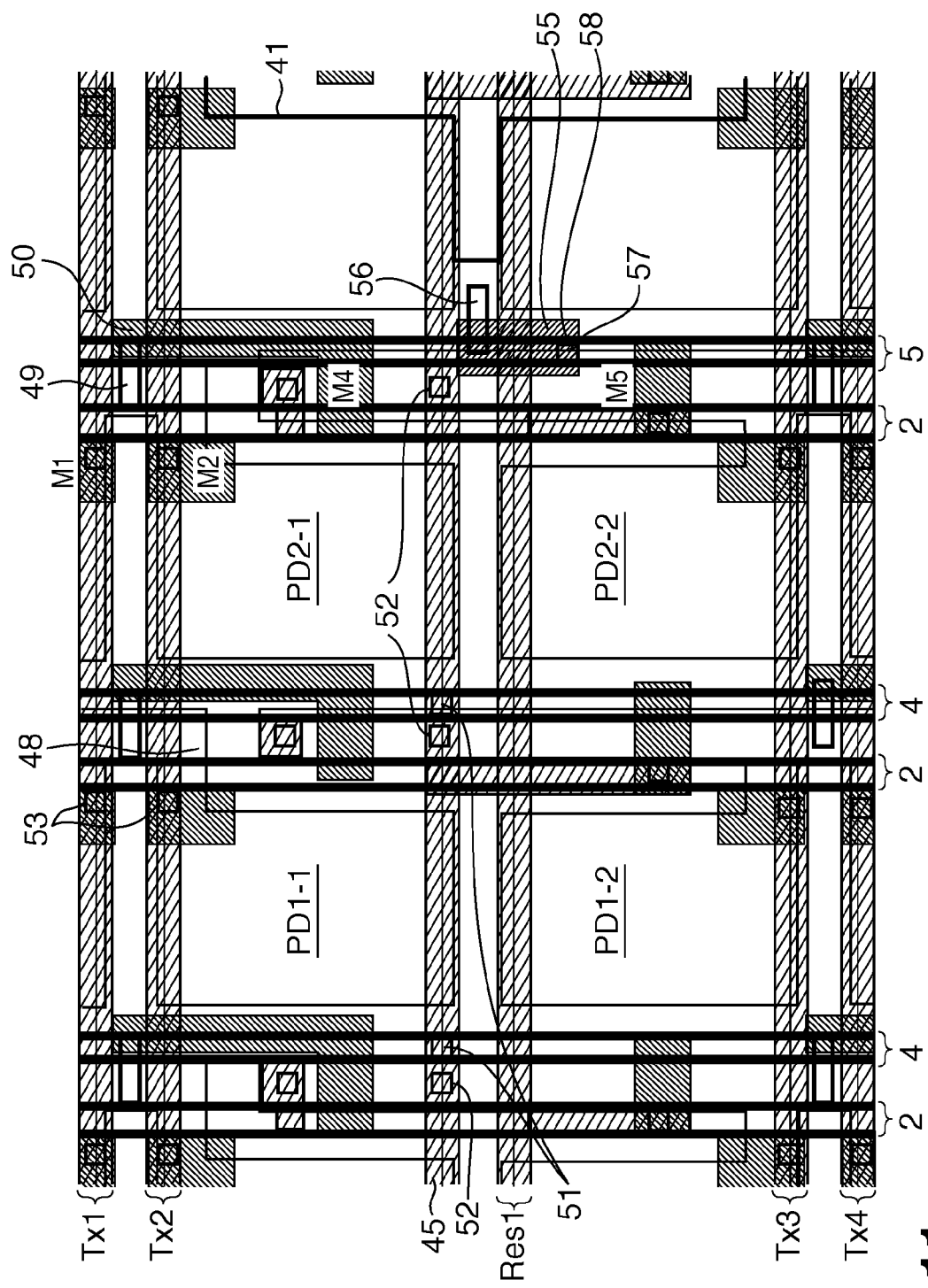
F I G. 11

PHOTOELECTRIC CONVERSION DEVICE

BACKGROUND OF THE INVENTION

1. Field of the Invention

The present invention relates to a technique suitable for a photoelectric conversion device, and particularly an image sensing MOS photoelectric conversion device having a small pixel pitch.

2. Description of the Related Art

These days, CMOS sensors have been developed actively as image sensing devices using MOS transistors. The CMOS sensor uses a MOS transistor in a pixel to amplify a change of the potential caused by accumulated carriers photoelectrically converted by a photodiode. The CMOS sensor reads out video information as an electrical signal from each pixel to a peripheral region via a signal line. Japanese Patent Laid-Open No. 09-046596 discloses details of the CMOS sensor. Demands have recently arisen for higher-resolution, more compact video and digital cameras using image sensing devices, lower manufacturing cost, and lower power consumption. These demands boost the development of small-pixel CMOS sensors having a small pixel pitch.

The present inventors have studied reducing the pixels of CMOS sensors, and have found a problem different from one arising when reducing the pixels of CCD sensors. This problem is diffraction of light by a conductive line. The conductive line of a CMOS sensor is positioned on a transparent passivation insulating layer about several hundred nm to several μm thick on a semiconductor layer. Light is diffracted by the conductive line and diverges within an interlayer dielectric film before reaching the semiconductor layer. Part of the light enters an adjacent pixel.

A small-pixel CMOS sensor cannot completely collect light onto a photodiode owing to the diffraction limit of an on-chip microlens. If the conductive line overlaps the photodiode, it reflects a large part of light, decreasing sensitivity.

SUMMARY OF THE INVENTION

The present invention provides a photoelectric conversion device advantageous in reducing optical color mixture caused by diffraction, and sensing a clear image with high color reproduction. Alternatively, the present invention provides a photoelectric conversion device advantageous in increasing sensitivity.

One of the aspects of the present invention provides a photoelectric conversion device in which at least a first metal wiring layer and a second metal wiring layer are arranged on a semiconductor substrate in an order named, the semiconductor substrate comprising a pixel region where a plurality of pixels are arrayed in a matrix, each pixel including at least a photoelectric conversion portion and an amplification transistor, wherein the second metal wiring layer includes power supply lines each configured to supply a power supply voltage to the amplification transistors of at least two pixel columns, and wherein the amplification transistor of a pixel column having no power supply line receives the power supply voltage from the power supply line via the first metal wiring layer.

In the photoelectric conversion device according to the present invention, an opening above a photodiode is widened by decreasing the number of conductive lines of a second metal wiring layer for each column. The photoelectric conversion device can advantageously reduce optical color mixture caused by diffraction, and sense a clear image with high color reproduction. The photoelectric conversion device of the present invention can also advantageously increase sensitivity because no conductive line reflects light which cannot be completely collected to the focus due to the diffraction limit of an on-chip microlens.

Further features of the present invention will become apparent from the following description of exemplary embodiments with reference to the attached drawings.

BRIEF DESCRIPTION OF THE DRAWINGS

FIG. 11 is a plan view showing the pixel region of a photoelectric conversion device according to the fourth embodiment of the present invention;

DESCRIPTION OF THE EMBODIMENTS

Five embodiments of the present invention will be described below. An arbitrary combination of the contents of these embodiments also falls within the scope of the present invention.

First Embodiment

In the first embodiment, as will be described later, a second metal wiring layer includes second-layer aluminum lines, and a first metal wiring layer includes first-layer aluminum lines. The first and second metal wiring layers are arranged on a semiconductor substrate in an order named. In the embodiment, one power supply line 4 of a second-layer aluminum line is arranged for two pixel columns. A power supply voltage is supplied through a first-layer aluminum line to MOS transistors on a pixel column having no power supply line. One power supply line supplies a power supply voltage to amplification transistors on at least two pixel columns. The power supply line preferably runs in the vertical direction (column direction).

Figure 1:
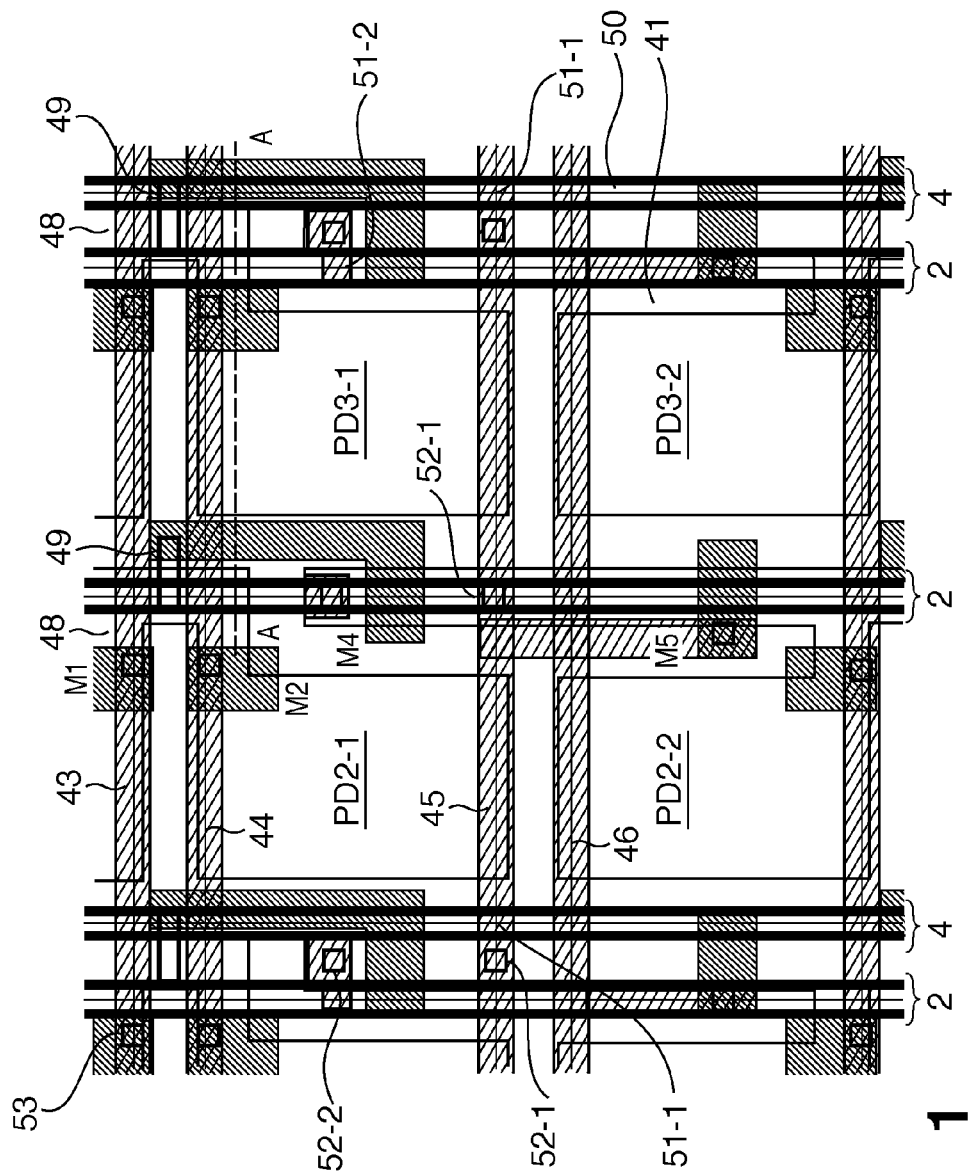
FIG. 1 is a plan view showing the pixel region of a photoelectric conversion device according to the first embodiment of the present invention.
Figure 2:
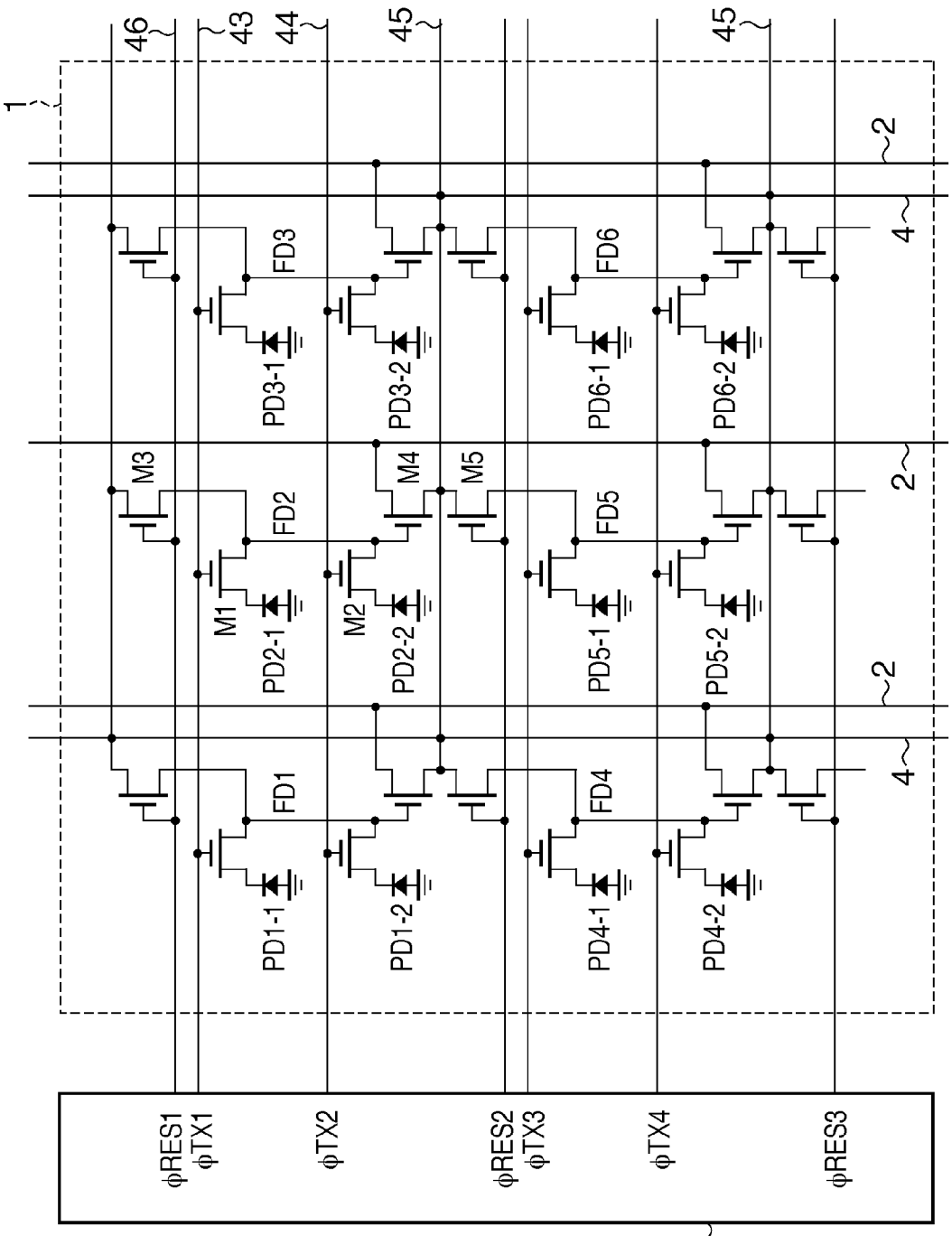
FIG. 2 is an equivalent circuit diagram of the pixel region and a vertical scanning circuit according to the first embodiment.

The first embodiment will be described with reference to FIGS. 1, 2, 3, 4, 5, 15A, and 15B. FIG. 1 is a plan view showing the pixel region of a photoelectric conversion device according to the first embodiment of the present invention. FIG. 2 is an equivalent circuit diagram of a vertical scanning circuit 7 and pixel region 1 according to the first embodiment.

The circuit arrangement of the first embodiment will be explained with reference to the equivalent circuit diagram of FIG. 2. For illustrative convenience, the circuit diagram of FIG. 2 shows a pixel region of 4×3=12 pixels. In practice, several million pixels can be arranged. In the pixel region 1, a plurality of pixels are arrayed in a matrix. The pixel region 1 includes, as conductive lines, signal lines 2, power supply lines 4, transfer gate lines 43 and 44, bridge lines 45, and reset lines 46. The vertical scanning circuit 7 scans (drives) the rows of the pixel region 1.

The signal line 2 and power supply line 4 are second-layer aluminum lines of the second metal wiring layer. The transfer gate lines 43 and 44, bridge line 45, and reset line 46 are first-layer aluminum lines of the first metal wiring layer.

Reference symbol "PD" denotes a photodiode (photoelectric conversion portion). For example, a photodiode PD3-2 is one on the second row and third column. Reference symbol "FD" denotes a floating diffusion, like FD1, FD2, and FD3. Reference symbols M1 and M2 denote transfer MOS transistors; M3 and M5, reset MOS transistors; and M4, an amplification MOS transistor (amplification transistor).

In the first embodiment, the photodiodes of two pixels and the transfer MOS transistors M1 and M2 of the respective pixels share one floating diffusion, one reset MOS transistor M3, and one amplification MOS transistor M4. Two pixels form one unit. More specifically, two photodiodes PD2-1 and PD2-2 are connected to a common floating diffusion FD2 via the transfer MOS transistors M1 and M2, respectively. This also applies to the remaining photodiodes.

The floating diffusion FD2 is connected to the source of the reset MOS transistor M3 and the gate of the amplification MOS transistor M4. The drain of the amplification MOS transistor M4 and that of the reset MOS transistor M5 of an adjacent unit are connected in an active region. A power supply voltage is supplied to these drains from the power supply line 4 of an adjacent column through the bridge line 45. More specifically, the amplification MOS transistor M4 and the like on a pixel column having no power supply line 4 receive a power supply voltage from the power supply line 4 of an adjacent column through the bridge line 45 of the first metal wiring layer.

This structure can omit the power supply line 4 on the right side of the pixel column of the photodiodes PD2-1, PD2-2, PD5-1, and PD5-2 serving as photoelectric conversion portions. The amplification MOS transistor M4 adopts a source follower structure which applies a gain to the potential of the floating diffusion FD2 connected to the gate of the amplification MOS transistor M4 to transmit a signal to the signal line 2 connected to its source. All the transistors M1, M2, M3, M4, and M5 in the pixel region 1 are n-channel MOS transistors.

Figure 15A:
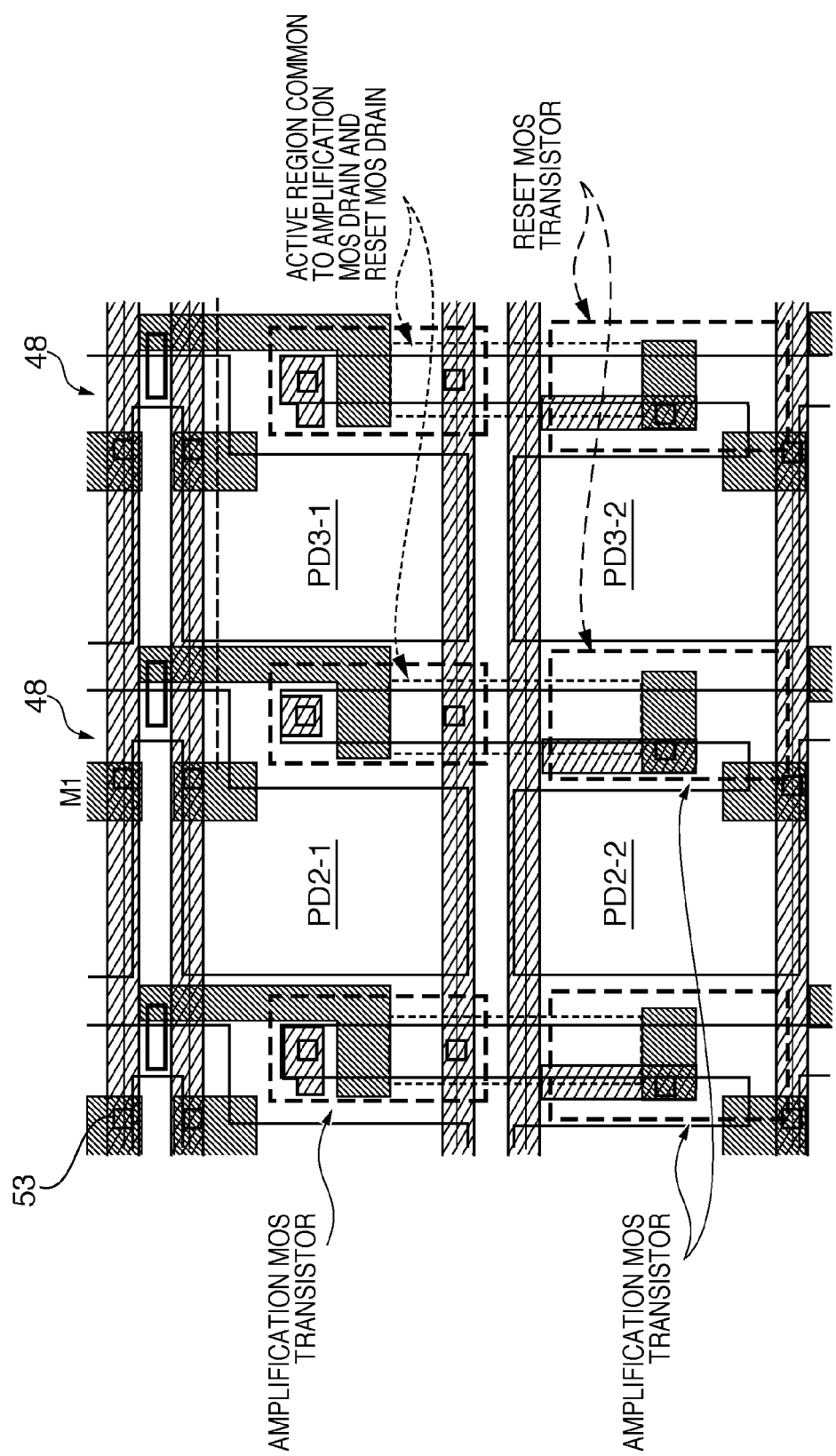
FIGS. 15A and 15B are plan views, respectively, when second-layer aluminum lines are not arranged and are arranged in the plan view of FIG. 1.
Figure 15B:
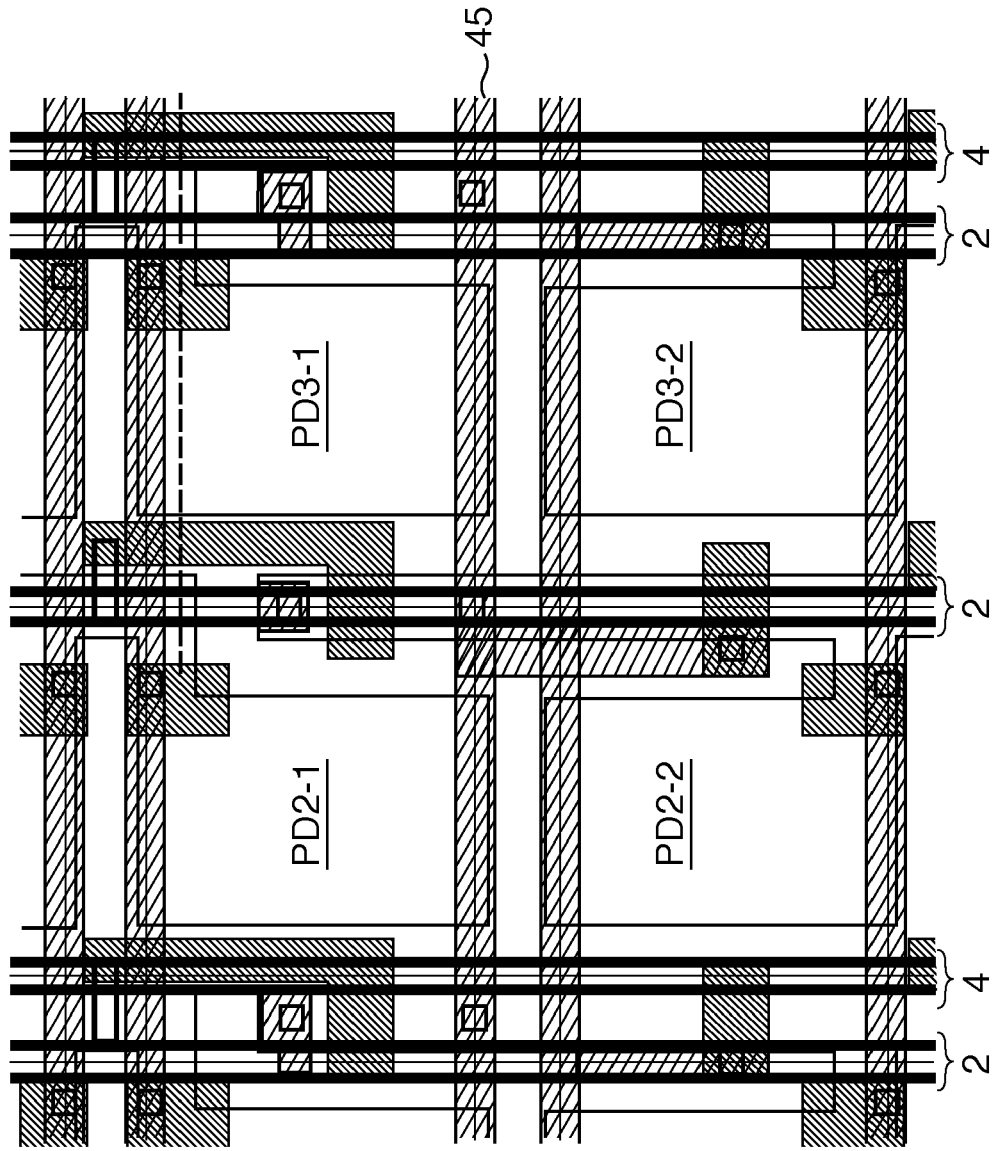

The pixel region in the plan view of FIG. 1 will be explained. In FIG. 1, the same reference numerals as those in FIG. 2 denote the same parts, and a description thereof will not be repeated. FIG. 15A is a plan view when no second-layer aluminum line is arranged in the plan view of FIG. 1. FIG. 15B is a plan view when second-layer aluminum lines are arranged. In FIG. 15A, broken lines indicate the boundaries of amplification MOS transistors and reset MOS transistors.

Referring to FIGS. 1, 15A, and 15B, photodiodes PD2-1, PD2-2, PD3-1, and PD3-2 serve as photoelectric conversion portions. Floating diffusions 48 correspond to FD1, FD2, FD3, and the like in FIG. 2. Each solid line 41 indicates the boundary between a field region and an active region. In the plan view of FIG. 1, a field oxide film for element isolation is formed on the right side of the boundary 41. An active region containing the photodiode PD3-1 is defined on the left side of the boundary 41.

Reference numeral 49 denotes a shared contact; and 50, a polysilicon region. Via plugs 51-1 and 51-2 electrically connect the power supply lines 4 and bridge line 45. Contact plugs 52-1 and 52-2 connect the bridge line 45 and the drains of the amplification MOS transistor M4 and reset MOS transistor M3. Reference numeral 53 denotes a polycontact. The shared contact 49 electrically connects the floating diffusion 48 and a conductive line of the polysilicon region 50.

The contact plugs 52-1 and 52-2 electrically connect first-layer aluminum lines and the source or drain of a MOS transistor. The polycontact 53 electrically connects a first-layer aluminum line and the polysilicon region 50. The via plugs 51-1 and 51-2 electrically connect first-layer aluminum lines and second-layer aluminum lines.

In the plan view of FIG. 1, the amplification MOS transistor M4 and reset MOS transistor M5 share their drains in an active region (see FIG. 15A). The active region receives a power supply voltage from the power supply line 4 of an adjacent column through the via plug 51-1, the bridge line 45 of a first-layer aluminum line, and the contact plug 52-1. The power supply voltage is preferably 1 to 5 V, and more preferably 2.5 to 3.3 V.

The number of electrons stored in the photodiode PD2-1 increases in accordance with the quantity of incident light. When the transfer gate line 44 receives an ON pulse, the transfer MOS transistor M2 is turned on to completely transfer electrons stored in the photodiode PD2-1 to the floating diffusion 48. The floating diffusion 48 is a capacitive element, and its potential drops in accordance with the number of electrons transferred from the photodiode PD2-1.

The floating diffusion 48 is connected to the gate electrode of the amplification MOS transistor M4 through the shared contact 49 and polysilicon region 50. The source of the amplification MOS transistor M4 is connected to the signal line 2 through the contact plug 52-2, first-layer aluminum line, and via plug 51-2.

Figure 3:
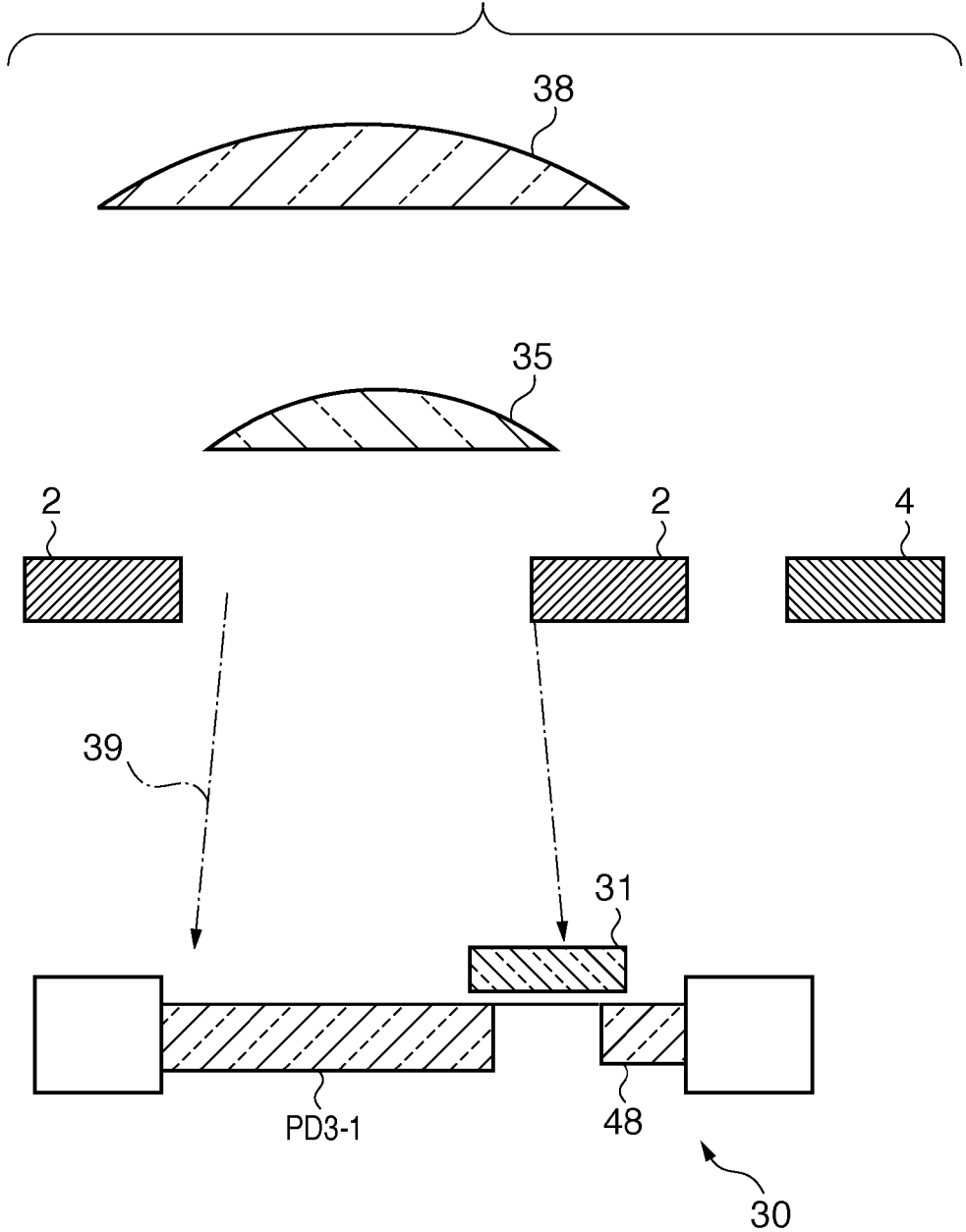
FIG. 3 is a sectional view taken along the line A-A in FIG. 1.

FIG. 3 is a sectional view taken along the line A-A in FIG. 1. In FIG. 3, the same reference numerals as those in FIG. 1 denote the same parts. Note that FIG. 1 does not illustrate an inner-layer lens 35 and on-chip microlens 38 in FIG. 3.

Referring to FIG. 3, reference numeral 30 denotes an Si wafer (semiconductor substrate); 31, a gate electrode of the transfer MOS transistor; 35, the inner-layer lens; 38, the on-chip microlens; and 39, diffracted light. Two second-layer aluminum lines, that is, the power supply line 4 and signal line 2 are arranged on the right side above the photodiode PD3-1 serving as a photoelectric conversion portion. Only one second-layer aluminum line, that is, the signal line 2 is arranged on the left side above the photodiode PD3-1.

In the entire area sensor, 1.5 second-layer aluminum lines are arranged for each photodiode column. This structure can suppress divergence of the diffracted light 39 and reduce optical color mixture, compared to a conventional structure in which two second-layer aluminum lines are arranged for each photodiode column. No second-layer aluminum line reflects light which cannot be completely collected due to the diffraction limit of the on-chip microlens 38 and inner-layer lens 35. This can increase sensitivity.

Although not shown in FIG. 3, the transfer gate lines 43 and 44, bridge line 45, and reset line 46 are formed from first-layer aluminum lines. The first-layer aluminum lines 43 to 46 are formed on an interlayer dielectric layer (not shown) between the semiconductor substrate 30 and the second-layer aluminum lines 2 and 4.

As shown in the plan view of FIG. 1, the end portion of a pixel is desirably arranged between the power supply line 4 and the signal line 2 on the right side of the column of the photodiode PD3-1. That is, the center of the interval between the power supply line 4 and the signal line 2 desirably coincides with a center line which runs in the channel length direction of the MOS transistor in a pixel including the photodiode PD3-1 and passes through the center of the channel width.

Only one signal line 2 is arranged as a second-layer aluminum line on the right side of the column of the photodiode PD2-1. The center line of the signal line 2 desirably coincides with a center line which runs in the channel length direction of the MOS transistor in a pixel including the photodiode PD2-1 and passes through the center of the channel width. That is, the end portion of the pixel is desirably arranged at the center of the signal line 2.

More specifically, when no power supply line 4 is arranged between the photodiodes PD2-1 and PD3-1, the signal line 2 is shifted rightward in FIG. 1, unlike a signal line 2 which is arranged at the same position as that when the power supply line 4 is arranged. This layout can equalize the areas of openings for the photodiodes PD2-1 and PD3-1, and the quantities of light entering the photodiodes PD2-1 and PD3-1. As a result, the columns of the photodiodes PD2-1 and PD3-1 are balanced.

Figure 4:
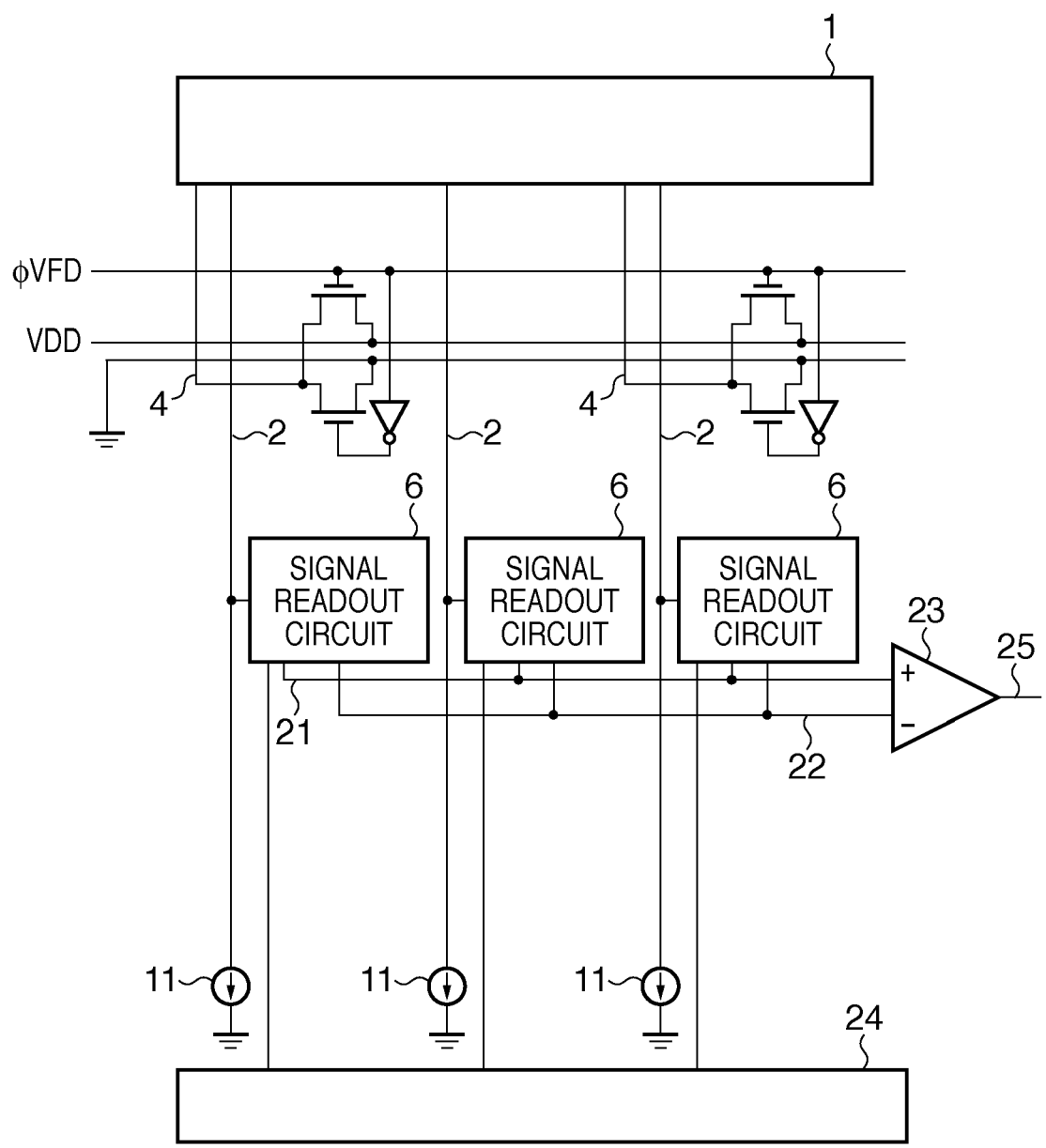
FIG. 4 is a circuit diagram showing a peripheral circuit region according to the first embodiment.
Figure 5:
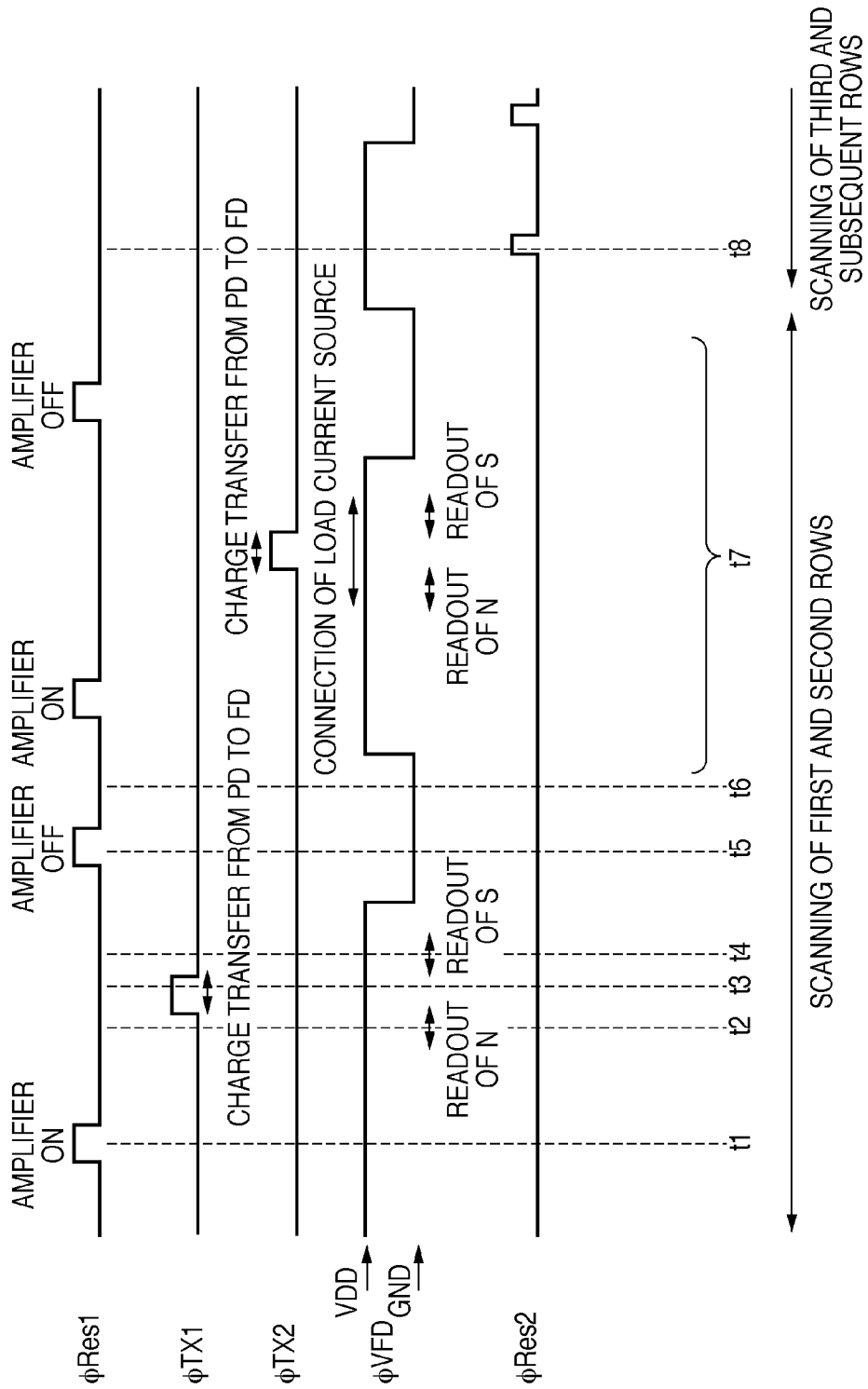
FIG. 5 is a driving timing chart of the first embodiment.

A driving method according to the first embodiment will be explained with reference to the circuit diagram of FIG. 4 showing a peripheral circuit region and the timing chart of FIG. 5. In FIG. 4, reference numeral 6 denotes a signal readout circuit; 11, a load current source; 21, a luminance-signal horizontal signal line; 22, a noise-level horizontal signal line; 23, a main amplifier; 24, a horizontal scanning circuit; and 25, an external signal terminal. φRes1, φTX1, and φTX2 represent the timings of voltages to the transfer gate line 43, transfer gate line 44, and reset line 46 shown in FIGS. 1 and 2. φVFD represents the timing of a voltage to a conductive line connected to the power supply line 4.

Scanning of the first row will be described. At timing t1, φRes1 changes to high level to turn on the reset MOS transistor M3 and select the potential of the floating diffusion FD1 as a power supply potential VDD. At the same time, the floating diffusions FD2 and FD3 on the same row as that of the floating diffusion FD1 are selected. At timing t2, the amplification MOS transistors M4 amplify the noise signals of the floating diffusions FD1, FD2, and FD3. The amplified noise signals are read out to the signal readout circuits 6 via the signal lines 2.

At timing t3, φTX1 changes to high level to turn on the transfer MOS transistor M1 and transfer electrons stored in the photodiode PD1-1 upon light irradiation to the floating diffusion FD1. At the same time, electrons stored in the photodiodes PD2-1 and PD3-1 upon light irradiation are transferred to the floating diffusions FD2 and FD3, respectively. At timing t4, the transfer MOS transistors M1 are turned off to read out the electrons generated in the photodiodes PD1-1, PD2-1, and PD3-1 upon light irradiation as luminance signals to the readout circuits 6 via the amplification MOS transistors M4 and signal lines 2.

At timing t5, φRes1 changes to high level to turn on the reset MOS transistors M3. The potentials of the floating diffusions FD1, FD2, and FD3 change to the ground potential GND, turning them off. At this time, the power supply line 4 is at the ground potential GND. At timing t6, the horizontal scanning circuit 24 reads out the noise levels and luminance signals stored in the readout circuits 6, and sends them to the main amplifier 23 via the noise-level horizontal signal line 22 and luminance-signal horizontal signal line 21, respectively.

The horizontal scanning circuit 24 sequentially supplies pulses to the readout circuits 6, reading out luminance signals and noise levels in series from a left column. The main amplifier 23 subtracts a noise level having passed through the noise-level horizontal signal line 22 from a luminance signal having passed through the luminance-signal horizontal signal line 21. The main amplifier 23 sends an external output luminance signal to the external signal terminal 25. Then, the scanning of the first row ends.

The second row is also scanned similarly to the first row except that the transfer MOS transistor M2 is turned on during the timing period t7. More specifically, in order to select the second row, φTX2 changes to high level to turn on the transfer MOS transistor M2 and transfer electrons stored in the photodiode PD1-2 upon light irradiation to the floating diffusion FD1. At the same time, electrons stored in the photodiodes PD2-2 and PD3-2 upon light irradiation are transferred to the floating diffusions FD2 and FD3, respectively.

As for the third row, φRes2 changes to high level at timing t8 to turn on the reset MOS transistors M5 and select the potentials of floating diffusions on the third and fourth rows as VDD. At this time, φRes1 is at low level and the reset MOS transistors M3 are OFF. Thus, the floating diffusions FD1, FD2, and FD3 on the first and second rows remain at GND.

Hence, the first and second rows are deselected and no signal is read out. Similarly, the reset MOS transistors on rows except for the third and fourth rows are OFF, so the floating diffusions on these rows remain at the ground potential GND, too. Thus, these rows are not selected and no signal is read out. This scanning is repeated for all rows, externally reading out luminance signals of one frame. Image information projected on the CMOS area sensor is converted into electrical signals of one frame.

The first embodiment may omit the power supply line 4 by supplying a power supply voltage from the peripheral region to MOS transistors in the pixel region using only the bridge line 45 shown in FIGS. 1 and 2. However, to maintain the readout speed, the load current source 11 in FIG. 4 is used to supply a constant current to the signal line 2. If the power supply line 4 is omitted, a voltage drop on the bridge line 45 becomes non-negligible in an area sensor having pixels on several thousand columns. To prevent this, one power supply line 4 is desirably arranged for two or four columns while thinning out the power supply lines 4, as described in the first embodiment.

Note that a selection transistor is not arranged in the first embodiment but may also be arranged. In a structure having no selection MOS transistor, a floating diffusion on a selected row is selected using a change of the potential of the power supply line, like the first embodiment. In a structure using the selection MOS transistor, a row is selected using a selection MOS transistor series-connected to the source or drain of the amplification MOS transistor M4. In this case, the gate of the selection MOS transistor is connected to a first-layer aluminum line running in the lateral direction.

The first embodiment widens an opening defined by second-layer aluminum lines, reducing color mixture caused by diffracted light and increasing sensitivity. According to the technique of sharing a transistor between two photodiodes, one pixel includes two transistors. The ratio of the photodiode area serving as a sensitive region becomes higher than that in a case in which no transistor is shared.

The transistor in the pixel region 1 is an n-channel MOS transistor in the first embodiment, but may also be a p-channel MOS transistor. In this case, the sign of each pulse supplied to the pixel region is reversed. In the first embodiment, it is desirable not to arrange, on a second-layer aluminum line, a layer which cuts off light, such as a third-layer aluminum line. This structure can enhance the effects of the present invention.

Second Embodiment

In the second embodiment, a second metal wiring layer includes second-layer copper lines, and a first metal wiring layer includes first-layer copper lines. One power supply line formed from a second-layer copper line is arranged for two pixel columns. A power supply voltage is supplied through a first-layer copper line to an amplification MOS transistor and the like on a pixel column having no power supply line. In the second embodiment, four photodiodes share one floating diffusion, one amplification MOS transistor, and one reset MOS transistor.

Figure 6:
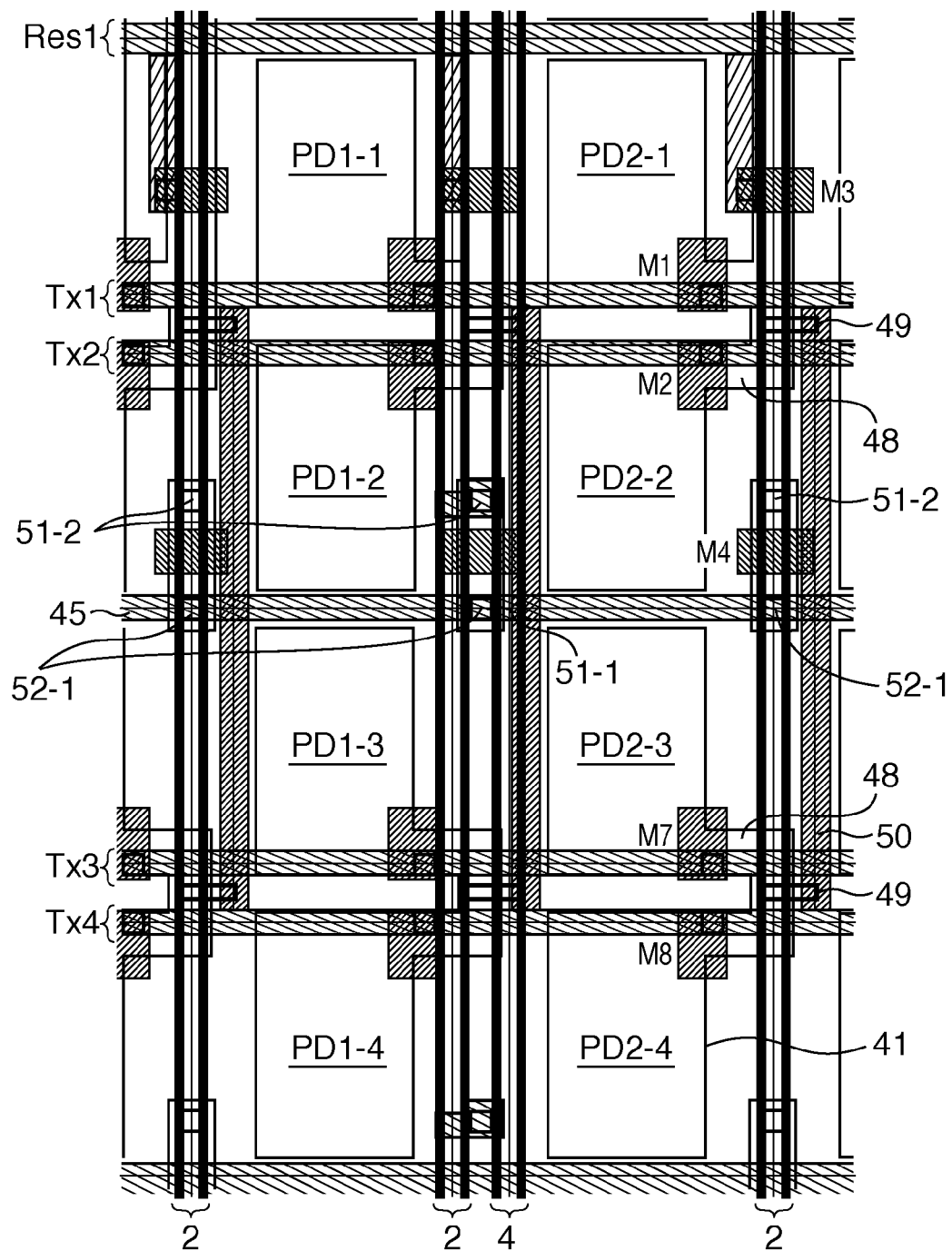
FIG. 6 is a plan view showing the pixel region of a photoelectric conversion device according to the second embodiment of the present invention.
Figure 7:
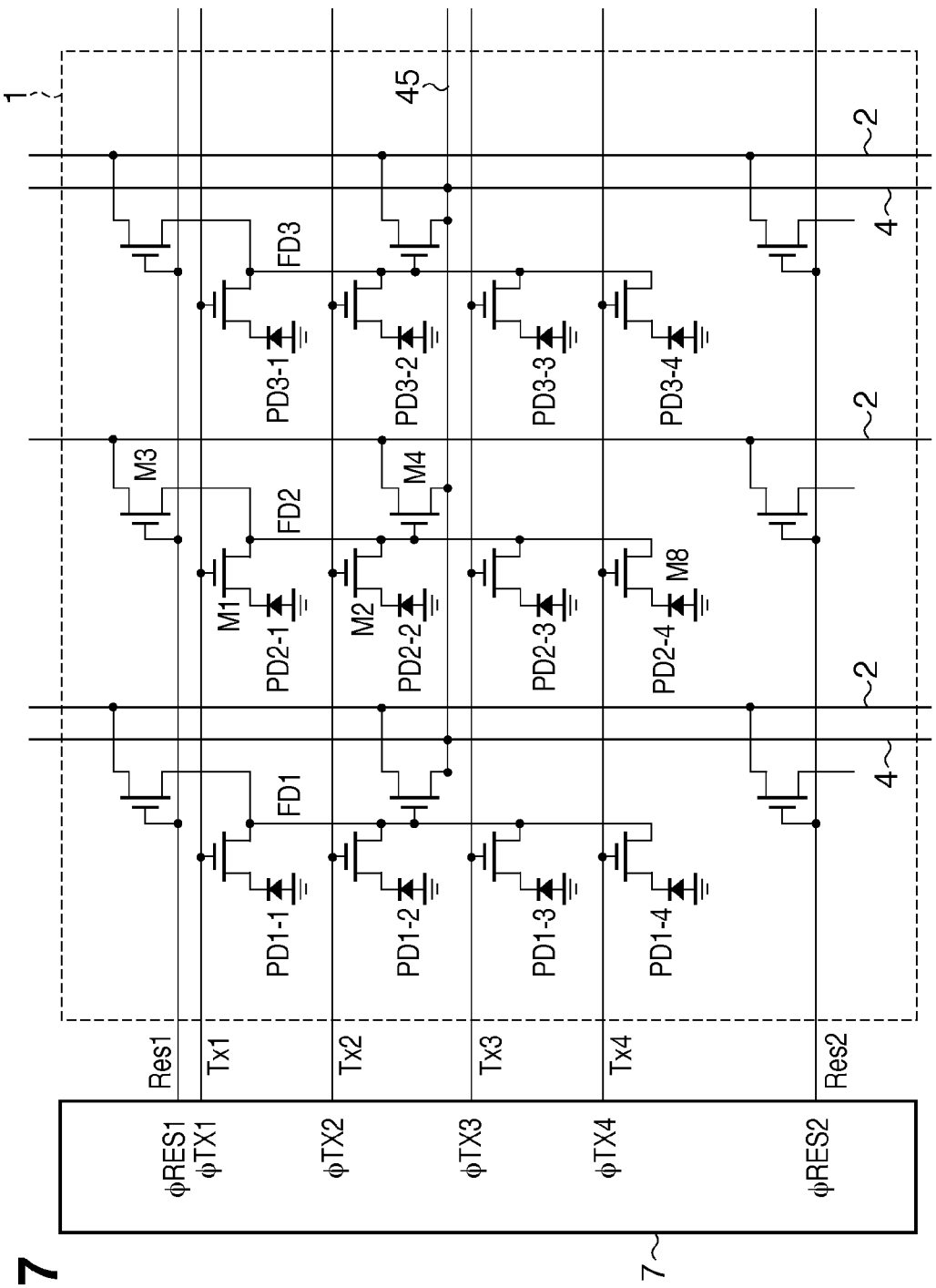
FIG. 7 is an equivalent circuit diagram of the pixel region and a vertical scanning circuit according to the second embodiment.

FIGS. 6, 7, 8, and 9 are views for explaining the second embodiment of the present invention. FIG. 6 is a plan view showing the pixel region of a photoelectric conversion device according to the second embodiment. FIG. 7 is an equivalent circuit diagram of a pixel region and vertical scanning circuit. For illustrative convenience, the equivalent circuit diagram of FIG. 7 shows a pixel region of 4×3=12 pixels. In practice, several tens of thousands of pixels can be arranged. In a pixel region 1, a plurality of pixels is arrayed in a matrix. In FIGS. 6 to 9, the same reference numerals as those in FIGS. 1 to 5 denote the same parts.

The second embodiment will be explained with reference to the equivalent circuit diagram of FIG. 7. Referring to FIG. 7, Res1 and Res2 represent reset lines, Tx1, Tx2, Tx3, and Tx4 represent transfer gate lines. Reference numeral 7 denotes a vertical scanning circuit; and 45, a bridge line. For example, a photodiode PD3-2 is one (photoelectric conversion portion) on the second row and third column. The remaining reference numerals are the same as those in FIG. 2.

In the second embodiment, the photodiodes and transfer MOS transistors of four pixels share one floating diffusion, one reset MOS transistor M3, and one amplification MOS transistor M4. Four pixels form one unit. For example, four photodiodes PD2-1, PD2-2, PD2-3, and PD2-4 are connected to a floating diffusion FD2 through respective transfer MOS transistors M1, M2, M7, and M8.

The floating diffusion FD2 is connected to the source of the reset MOS transistor M3 and the gate of the amplification MOS transistor M4. The amplification MOS transistor M4 receives a power supply voltage from a power supply line 4 of an adjacent column through the bridge line 45. This structure can omit the power supply line 4 for the column of the photodiodes PD2-1, PD2-2, PD2-3, and PD2-4.

The amplification MOS transistor M4 employs a source follower structure which applies a gain to the potential of the floating diffusion FD2 connected to the gate of the amplification MOS transistor M4 to transmit a signal to a signal line 2 connected to its source. In the second embodiment, the drain electrode of a reset MOS transistor M5 is connected to the signal line 2. The signal line 2 supplies the reset potential of the floating diffusion. A driving method in this case will be described later.

The pixel region in the plan view of FIG. 6 will be explained. Referring to FIG. 6, floating diffusions 48 correspond to FD1, FD2, FD3, and the like in FIG. 7. The remaining reference numerals are the same as those in FIG. 1. In the second embodiment, two active regions of the floating diffusion 48 are electrically connected to a polysilicon conductive line through a shared contact 49.

The drain of the amplification MOS transistor M4 receives a power supply voltage through the power supply line 4, a via plug 51-1, the bridge line 45, and a contact plug 52-1. The amplification MOS transistor M4 and the like on a pixel column having no power supply line 4 receive a power supply voltage from the power supply line 4 of an adjacent column through the bridge line 45 of the first metal wiring layer.

As shown in the plan view of FIG. 6, the end portion of a pixel is desirably arranged between the power supply line 4 and the signal line 2 on the right side of the column of the photodiode PD1-1. That is, the center of the interval between the power supply line 4 and the signal line 2 desirably coincides with a center line connecting the source and drain of a MOS transistor in a pixel including the photodiode PD1-1.

Only one signal line 2 is arranged as a second-layer copper line on the right side of the column of the photodiode PD2-1. The center line of the signal line 2 desirably coincides with a center line which runs in the channel length direction of the MOS transistor in a pixel including the photodiode PD1-1 and passes through the center of the channel width. That is, the end portion of the pixel is desirably arranged at the center of the signal line 2.

Similar to the first embodiment, this layout can equalize the areas of openings for the photodiodes PD1-1 and PD2-1, and the quantities of light entering the photodiodes PD1-1 and PD2-1. The columns of the photodiodes PD1-1 and PD2-1 are therefore balanced.

Figure 8:
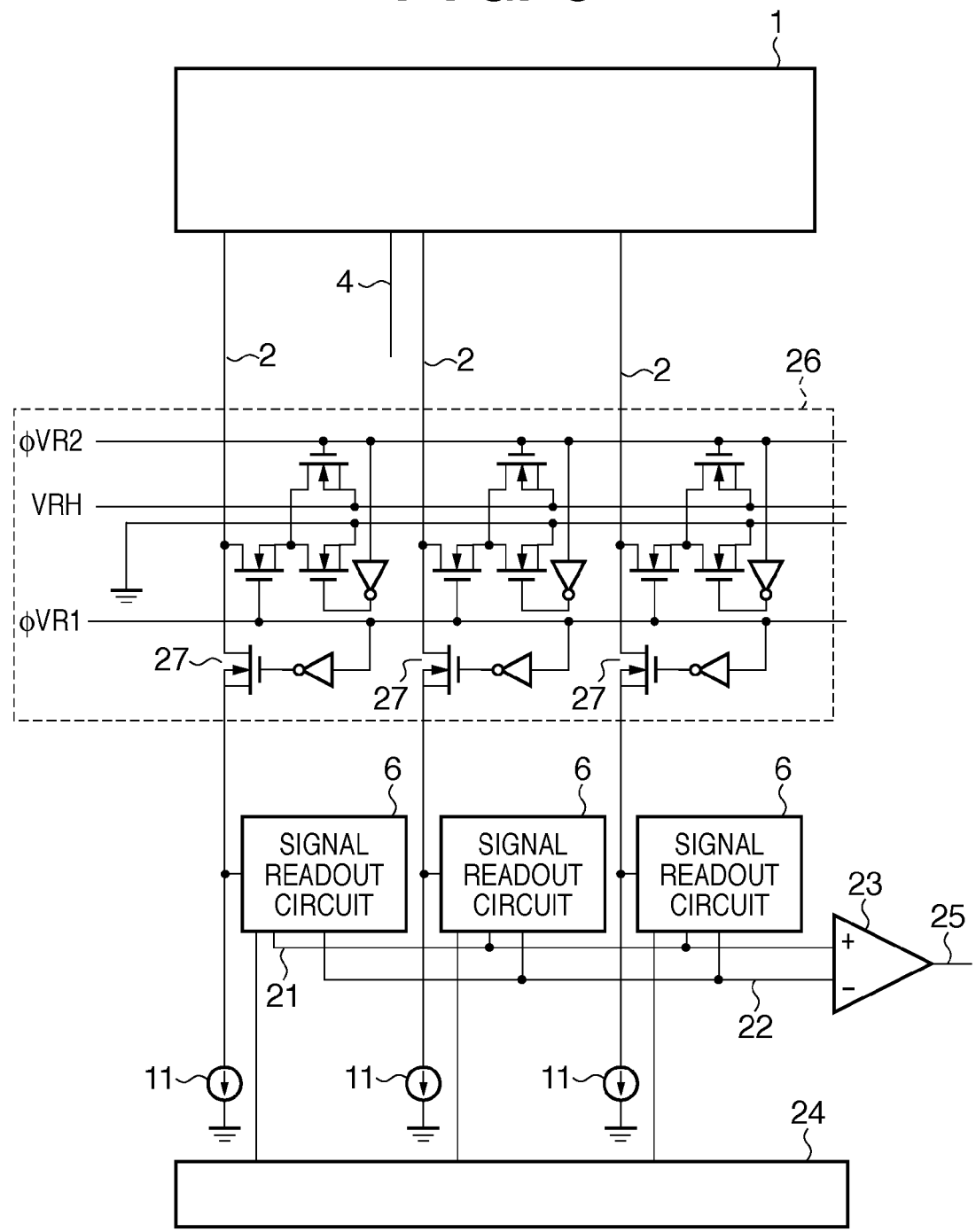
FIG. 8 is a circuit diagram showing a peripheral circuit region according to the second embodiment.
Figure 9:
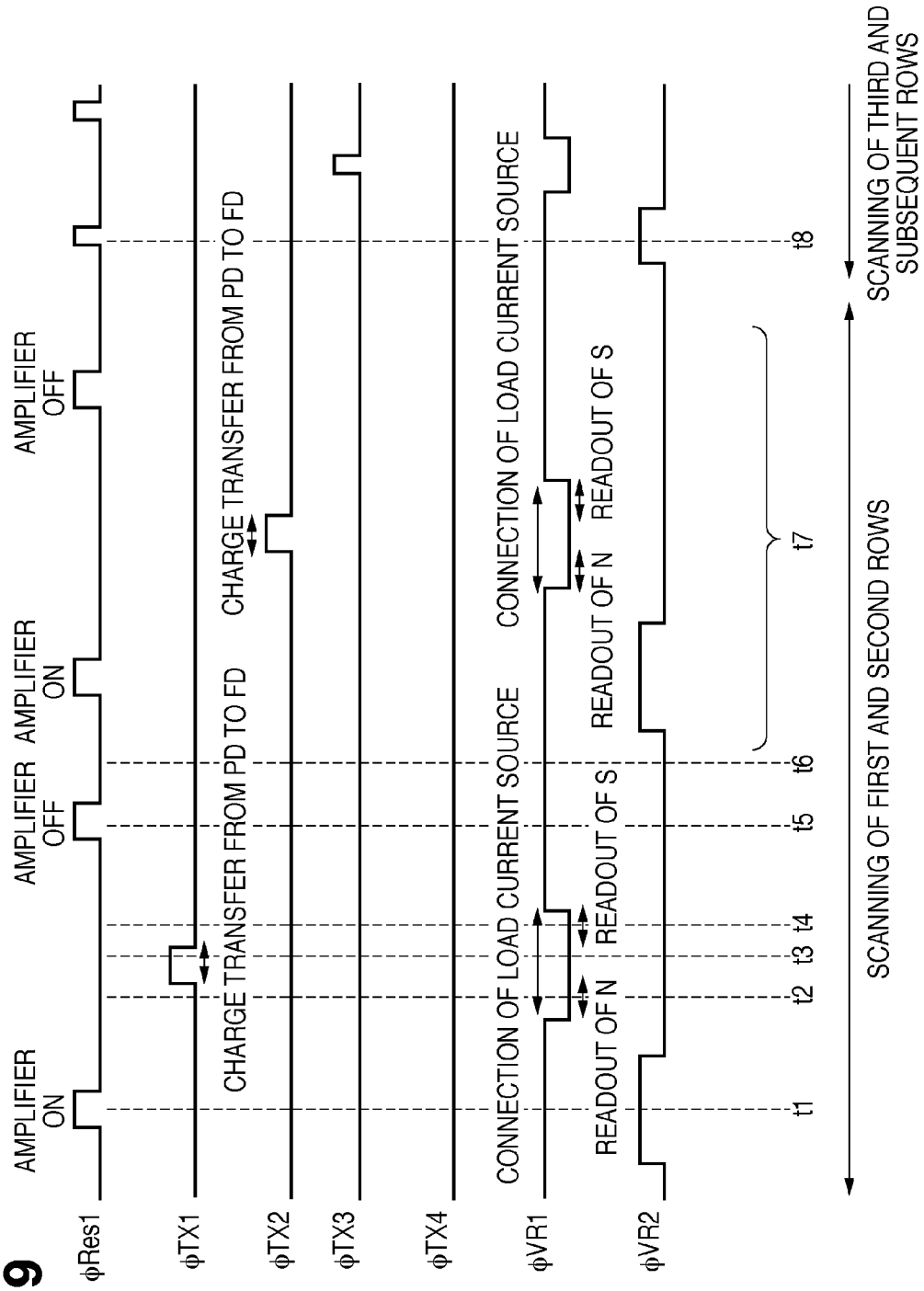
FIG. 9 is a driving timing chart of the second embodiment.

A driving method according to the second embodiment will be explained with reference to the circuit diagram of FIG. 8 showing a peripheral circuit region and the timing chart of FIG. 9. In FIG. 8, reference numeral 26 denotes an FD potential supply circuit; and 27, a MOS transistor for disconnecting a load current source. In FIG. 8, the remaining reference numerals are the same as those in FIG. 4. In FIG. 9, $\phi$Res1, $\phi$TX1, $\phi$TX2, $\phi$TX3, $\phi$TX4, and $\phi$Res2 represent the timings of voltages to the reset line Res1, transfer gate line Tx1, transfer gate line Tx2, transfer gate line Tx3, transfer gate line Tx4, and reset line Res2. $\phi$VR1 and $\phi$VR2 represent voltage pulses supplied to the FD potential supply circuit 26 in FIG. 8.

At timing t1, $\phi$Res1 changes to high level to turn on the reset MOS transistor M3, change the potential of the floating diffusion FD1 to high potential VRH, and select the floating diffusion FD1. At the same time, reset MOS transistors on the same row as that of the reset MOS transistor M3 are turned on to select the floating diffusions FD2 and FD3 and the like, too.

At timing t2, the amplification MOS transistors M4 amplify the noise signals of the floating diffusions FD1, FD2, and FD3. The amplified noise signals are read out to readout circuits 6 via the signal lines 2. At timing t3, $\phi$TX1 changes to high level to turn on the transfer MOS transistor M1 and transfer electrons stored in the photodiode PD1-1 upon light irradiation to the floating diffusion FD1. At the same time, electrons stored in the photodiodes PD2-1 and PD3-1 upon light irradiation are transferred to the floating diffusions FD2 and FD3, respectively. At timing t4, the transfer MOS transistors M1 are turned off to read out the electrons generated in the photodiodes PD1-1, PD2-1, and PD3-1 upon light irradiation as luminance signals to the readout circuits 6 via the amplification MOS transistors M4 and signal lines 2.

At timing t5, φRes1 changes to high level to turn on the reset MOS transistors M3. The potentials of the floating diffusions FD1, FD2, and FD3 change to GND, turning them off. At timing t6, a horizontal scanning circuit 24 reads out the noise levels and luminance signals stored in the readout circuits 6, and sends them to a main amplifier 23 via a noise-level horizontal signal line 22 and luminance-signal horizontal signal line 21, respectively.

At this time, the horizontal scanning circuit 24 sequentially supplies pulses to the readout circuits 6, reading out luminance signals and noise levels in series from a left column. The main amplifier 23 subtracts a noise level having passed through the noise-level horizontal signal line 22 from a luminance signal having passed through the luminance-signal horizontal signal line 21. The main amplifier 23 sends an external output luminance signal to an external signal terminal 25. Then, the scanning of the first row ends.

The second row is also scanned similarly to the first row except that the transfer MOS transistor M2 is turned on during the timing period t7. More specifically, in order to select the second row, φTX2 changes to high level to turn on the transfer MOS transistor M2 and transfer electrons stored in the photodiode PD1-2 upon light irradiation to the floating diffusion FD1. At the same time, electrons stored in the photodiodes PD2-2 and PD3-2 upon light irradiation are transferred to the floating diffusions FD2 and FD3, respectively. At this time, floating diffusions except for the floating diffusions FD1, FD2, and FD3 for four rows remain at potential GND and are not selected.

As for the third row, φRes1 changes to high level at timing t8 to turn on the reset MOS transistors M3 and scan the third row. This scanning is repeated for all rows, externally reading out luminance signals of one frame. In the second embodiment, the power supply line 4 always supplies a high potential VDD.

A selection transistor is not arranged in the second embodiment but may also be arranged. In a structure having no selection MOS transistor, a floating diffusion on a selected row is selected using a change of the potential of the signal line, like the second embodiment. In a structure using the selection MOS transistor, a row is selected using a selection MOS transistor series-connected to the source or drain of the amplification MOS transistor M4. In this case, the gate of the selection MOS transistor is connected to a first-layer copper line running in the lateral direction.

The second embodiment widens an opening defined by second-layer copper lines, reducing color mixture caused by diffracted light and increasing sensitivity. According to the technique of sharing a transistor between four photodiodes, one pixel includes 1.5 transistors. The ratio of the photodiode area serving as a sensitive region can increase.

Third Embodiment

In the third embodiment, a first metal wiring layer is a wiring layer including a polysilicon region, and a second metal wiring layer includes first-layer aluminum lines. The pixel region does not include a second-layer aluminum line. One power supply line formed from a first-layer aluminum line is arranged for two pixel columns. A power supply voltage is supplied through the polysilicon conductive line to MOS transistors on a pixel column having no power supply line.

Figure 10:
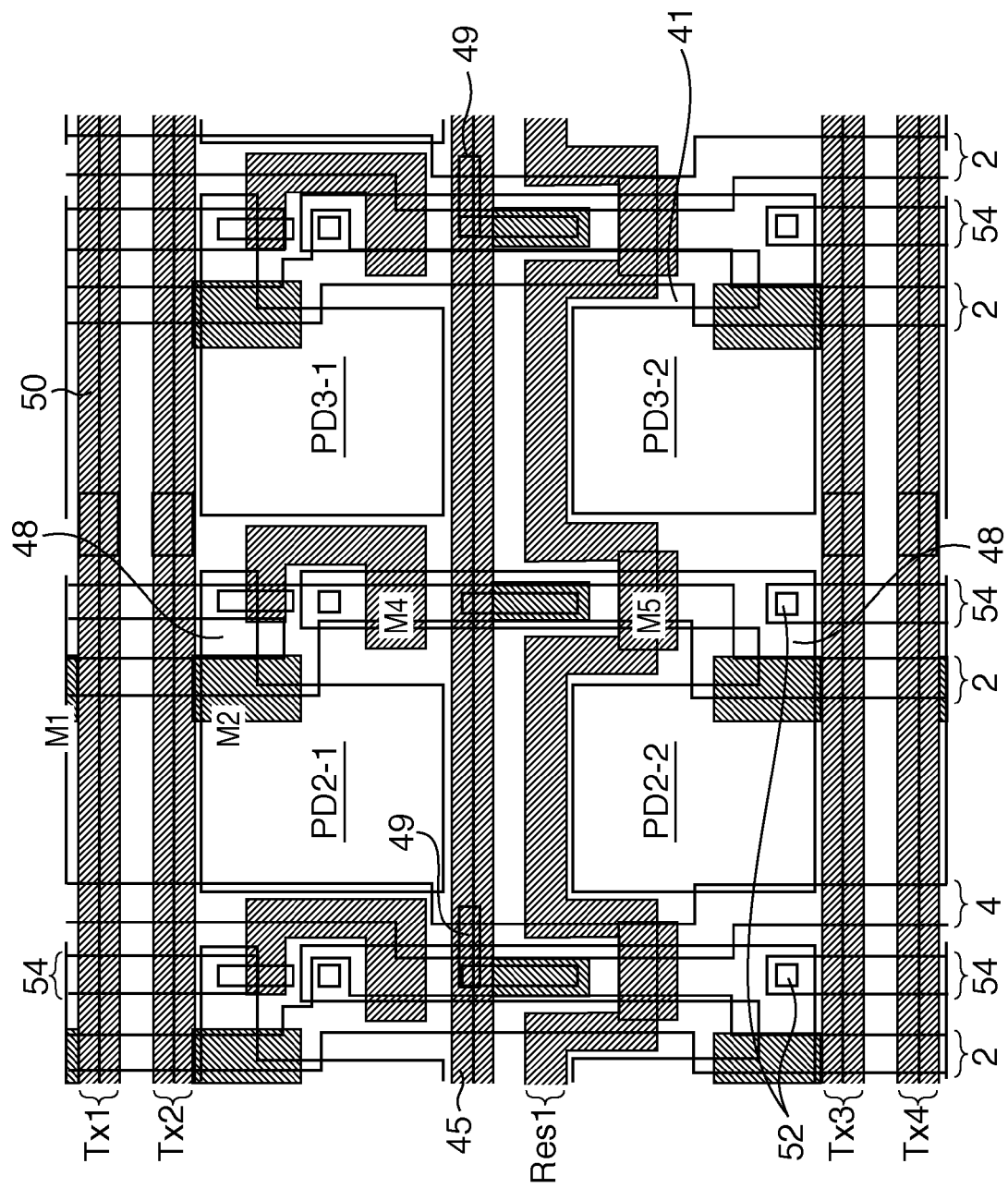
FIG. 10 is a plan view showing the pixel region of a photoelectric conversion device according to the third embodiment of the present invention.

FIG. 10 is a plan view of the pixel region of a photoelectric conversion device according to the third embodiment of the present invention. In FIG. 10, the same reference numerals as those in FIG. 1 or 6 denote the same parts. The equivalent circuit diagram of the pixel region and the like is the same as that of FIG. 2 in the first embodiment. In FIG. 10, a first-layer aluminum line 54 connects an FD. The remaining reference numerals are the same as those in FIG. 1 or 6.

In the third embodiment, a polysilicon region 50 includes transfer gate lines Tx1, Tx2, Tx3, and Tx4 running in the lateral direction, a reset line Res1, and a bridge line 45. The polysilicon region 50 also includes the gate electrodes of transfer MOS transistors M1 and M2, an amplification MOS transistor M4, and a reset MOS transistor M5.

The structure of the third embodiment uses the polysilicon region 50 as conductive lines. At least a part of the polysilicon region 50 that runs as a conductive line is desirably covered on its upper surface with a metal silicide or salicide to decrease the electrical resistance. The polysilicon region 50 runs horizontally as a lateral conductive line. Thus, two floating diffusions 48 are electrically connected to the polysilicon region 50 via the FD connection first-layer aluminum lines 54 to share it.

The peripheral circuit is the same as that described with reference to FIG. 4 in the first embodiment. The driving timings are also the same as those described with reference to FIG. 5 in the first embodiment. In the third embodiment, a metal wiring layer is a wiring layer formed from the polysilicon region. Since no second-layer aluminum line is used, no conductive line is arranged apart from a semiconductor substrate 30. This structure further suppresses color mixture caused by diffracted light and increases sensitivity.

Fourth Embodiment

The fourth embodiment forms a well contact in the pixel region using a second metal wiring layer. The well contact stabilizes the well potential of the pixel region from the end portion to the center temporally and spatially, preventing shading and the like. In the fourth embodiment, similar to the first embodiment, a first metal wiring layer includes first-layer aluminum lines, and a second metal wiring layer includes second-layer aluminum lines.

One power supply line formed from a second-layer aluminum line is arranged for two pixel columns. A power supply voltage is supplied through a first-layer aluminum line to an amplification MOS transistor and the like on a pixel column having no power supply line. This allows arranging a ground line using a second-layer aluminum line for a pixel column having no power supply line.

Figure 12:
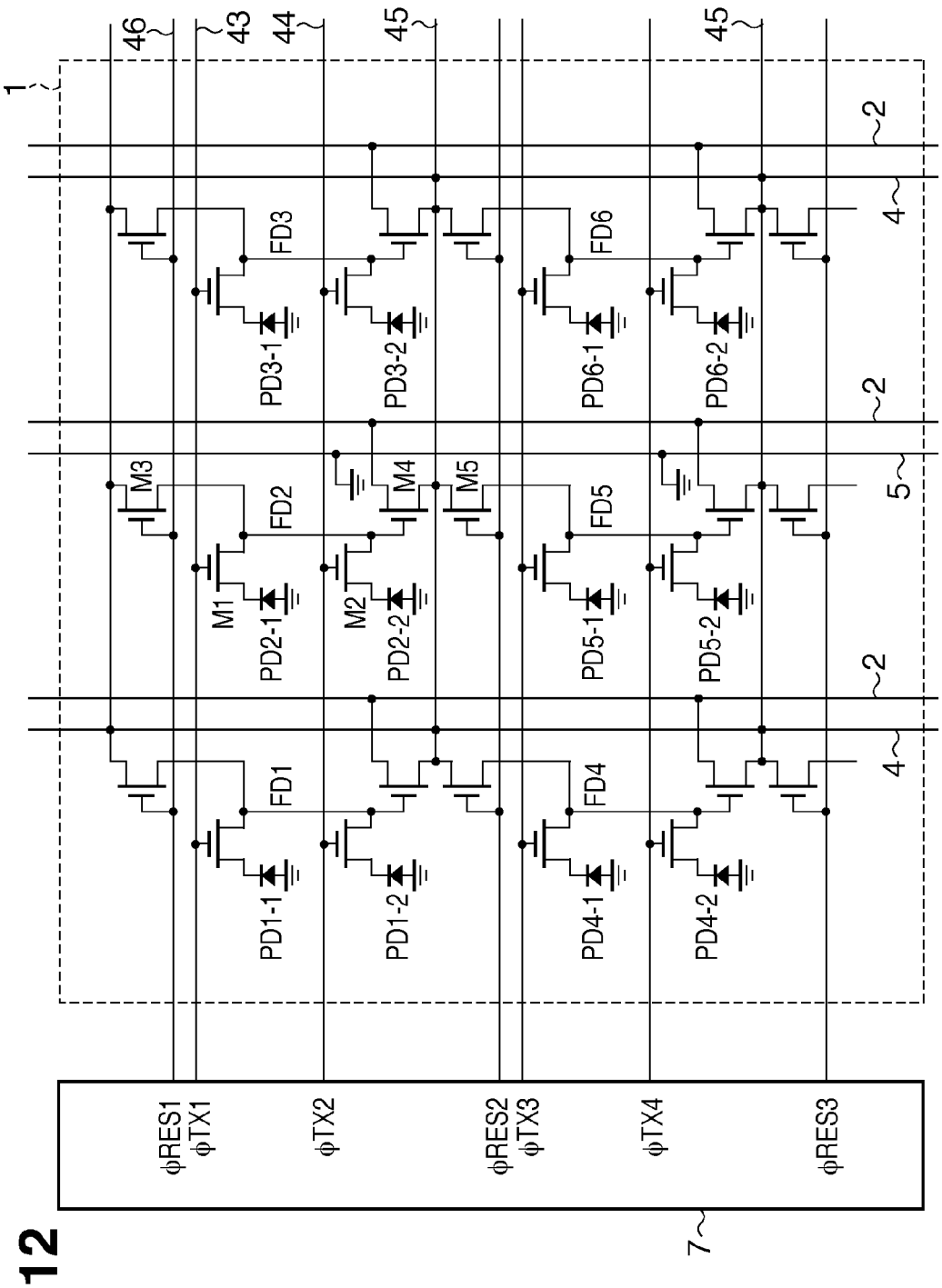
FIG. 12 is an equivalent circuit diagram of the pixel region and a vertical scanning circuit according to the fourth embodiment.

FIG. 11 is a plan view showing the pixel region of a photoelectric conversion device according to the fourth embodiment. FIG. 12 is an equivalent circuit diagram of the pixel region and a vertical scanning circuit according to the fourth embodiment. In FIGS. 11 and 12, the same reference numerals as those in FIGS. 1 and 2 and the like denote the same parts.

The fourth embodiment will be explained with reference to FIGS. 11 and 12. The equivalent circuit diagram of FIG. 12 will be described first. The equivalent circuit diagram of FIG. 12 is almost the same as that of FIG. 2 in the first embodiment except that a ground line 5 runs in the longitudinal direction. The ground line 5 is fixed to the ground potential outside a pixel region 1. Hence, the p-type well of the pixel region temporally and spatially stabilizes at the ground potential.

Next, the pixel region in the plan view of FIG. 11 will be explained. An amplification MOS transistor M4 and reset MOS transistor M5 receive a power supply voltage from a power supply line 4 formed from a second-layer aluminum line through a via plug 51, a bridge line 45 formed from a first-layer aluminum line, and a contact plug 52.

The power supply line can be arranged even in the lateral direction using the bridge line 45. The power supply line 4 can therefore be omitted from the right side of a photodiode PD2-1 to arrange the ground line 5 here in the longitudinal direction. That is, the ground line 5 for forming a well contact in the pixel region is arranged using a second-layer aluminum line of the second metal wiring layer on a pixel column having no power supply line 4, as shown in FIG. 11.

The ground line 5 supplies the ground potential from the outside of the pixel region, and fixes the p-type well of the pixel region to the ground potential through a via plug 57, contact plug 58, polysilicon region 55, and shared contact 56. An active region below the shared contact 56 has an ohmic contact, so at least the contact region is a heavily doped p-type region.

The heavily doped p-type region is connected to the p-type well regions of transistors M1, M2, M3, M4, and M5 in the pixel region, all of which are n-channel MOS transistors. When driving the transistors M1, M2, M3, M4, and M5, their p-type well regions stabilize at the ground potential. Thus, the transistors M1, M2, M3, M4, and M5 are driven stably.

All the transistors in the pixel region are n-channel MOS transistors in the fourth embodiment, but may also be p-channel MOS transistors. In this case, the well in the pixel region is of the n type. The n-type well receives a power supply potential such as VDD by the same method as that described above.

The fourth embodiment can ensure a maximum of one ground of a p-type well in a pixel for 2×2=4 or more pixels. However, the number of grounds may also be greatly decreased to, for example, one for 100×100=10,000 pixels. A driving method according to the fourth embodiment is the same as that described in the first embodiment with reference to the circuit diagram of FIG. 4 showing a peripheral circuit region and the timing chart of FIG. 5.

Although the fourth embodiment adopts conductive lines for fixing the wells of pixels, neither the number of first-layer aluminum lines nor that of second-layer aluminum lines increases. To the contrary, a conventional structure has only first- and second-layer aluminum lines. To lay out a ground line, the number of first- or second-layer aluminum lines needs to be increased by one.

Compared to a conventional pixel region where ground lines are arranged, the fourth embodiment can widen an opening defined by a metal wiring layer, reducing color mixture caused by divergent diffracted light. The fourth embodiment can arrange pixels symmetrically, prevent color inconsistency at the periphery of pixels, and increase sensitivity.

Fifth Embodiment

The fifth embodiment forms a well contact in the pixel region using a second metal wiring layer. In the fifth embodiment, a first metal wiring layer includes first-layer aluminum lines, and a second metal wiring layer includes second-layer aluminum lines.

One power supply line formed from a second-layer aluminum line is arranged for four pixel columns. A power supply voltage is supplied through a first-layer aluminum line to an amplification MOS transistor and the like on a pixel column having no power supply line. This allows arranging a ground line (second-layer aluminum line) for one center pixel column among three pixel columns having no power supply line. Further, an opening defined by second-layer aluminum lines can be widened.

Figure 13:
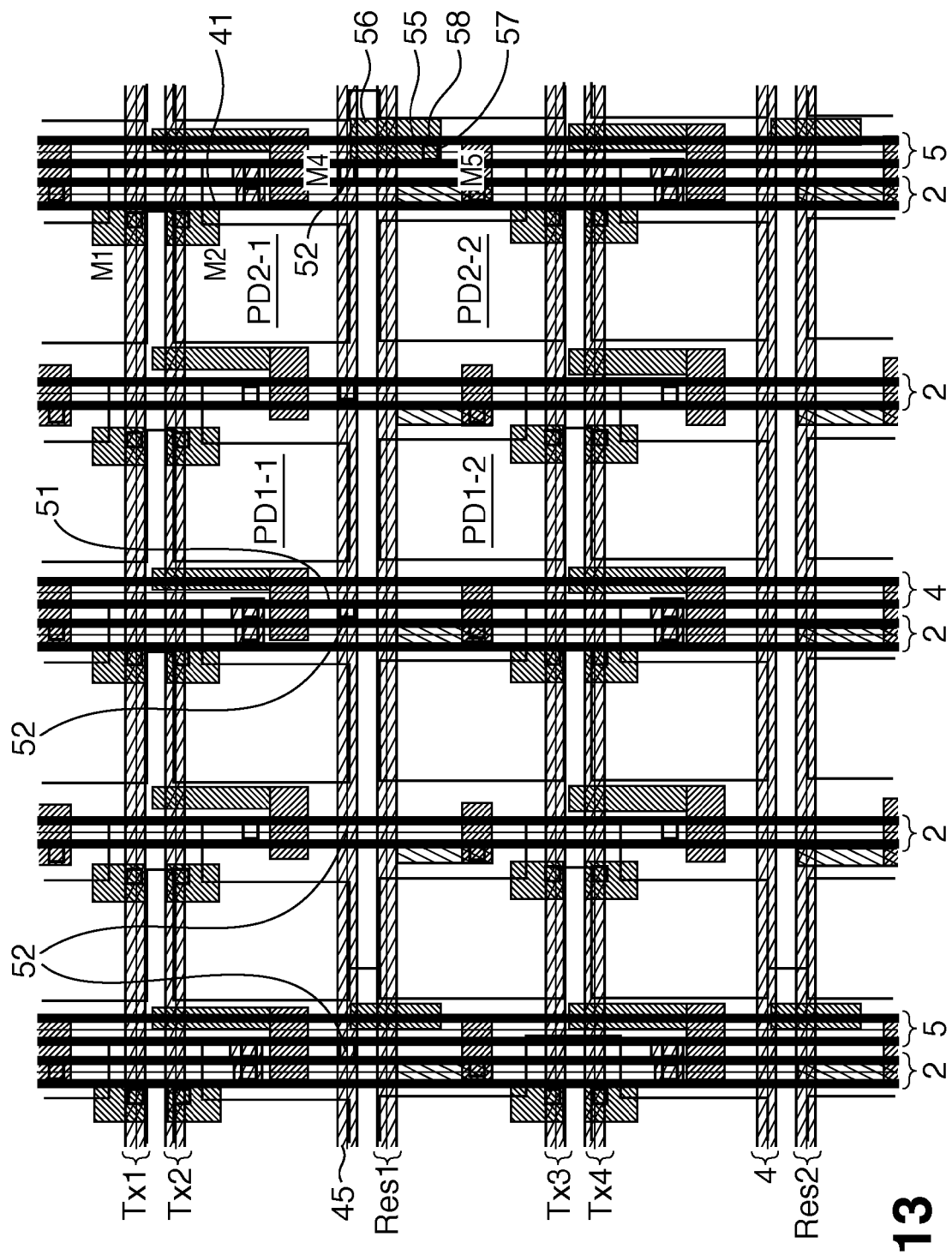
FIG. 13 is a plan view showing the pixel region of a photoelectric conversion device according to the fifth embodiment of the present invention.
Figure 14:
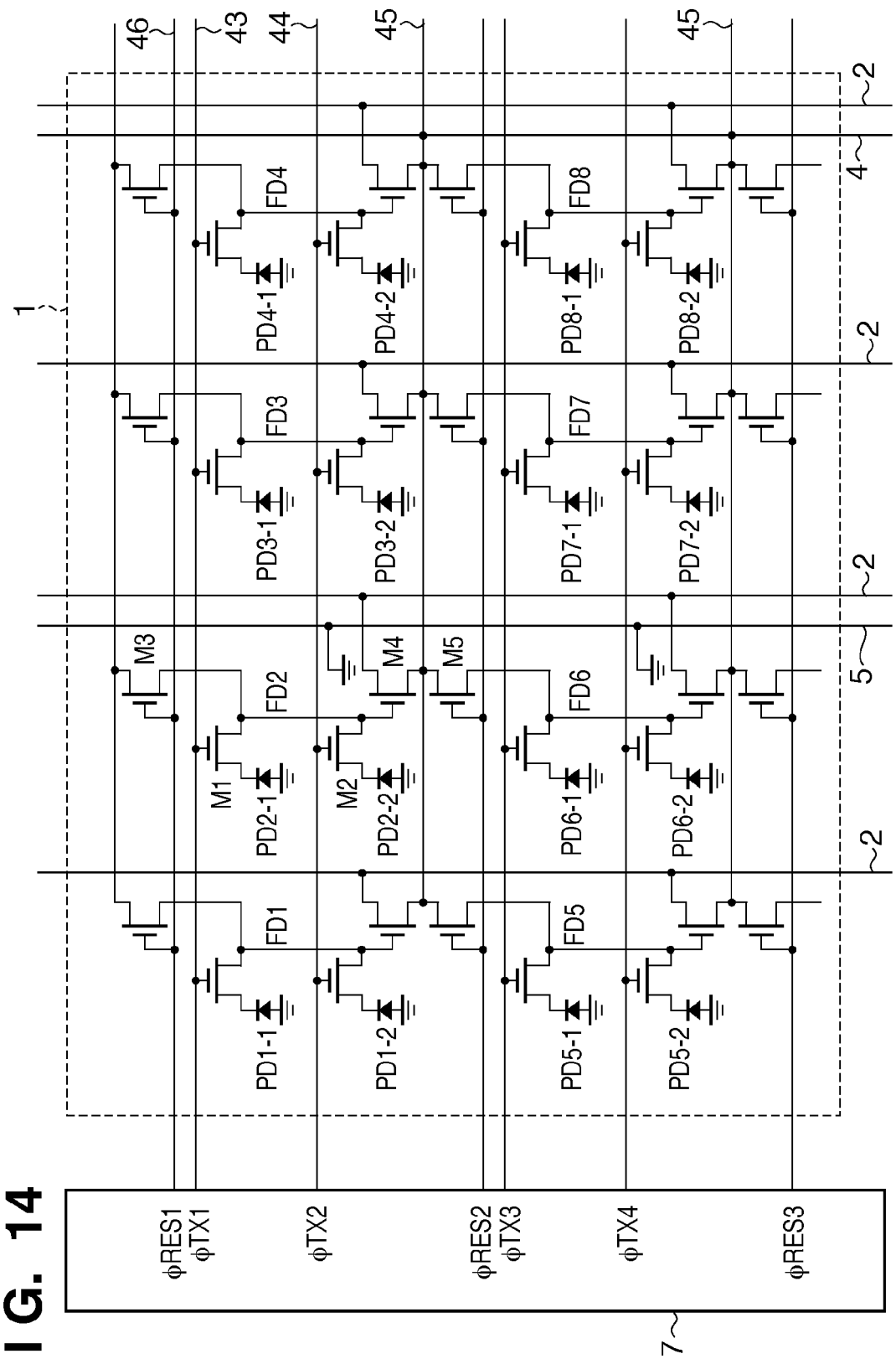
FIG. 14 is an equivalent circuit diagram of the pixel region and a vertical scanning circuit according to the fifth embodiment.

The fifth embodiment will be explained with reference to the plan view of FIG. 13 showing a pixel region and the equivalent circuit diagram of FIG. 14 showing a pixel region and vertical scanning circuit. In FIGS. 13 and 14, the same reference numerals as those in FIGS. 11 and 12 and the like denote the same parts.

The equivalent circuit diagram of FIG. 14 will be explained first. The equivalent circuit diagram of FIG. 14 is almost the same as that of FIG. 12 except that one power supply line 4 and one ground line 5 are arranged for four pixel columns. The ground line 5 is fixed to the ground potential outside the pixel region.

Next, the pixel region in the plan view of FIG. 13 will be explained. An amplification MOS transistor M4 and reset MOS transistor M5 receive a power supply voltage from the power supply line 4 formed from a second-layer aluminum line through a via plug 51, a bridge line 45 formed from a first-layer aluminum line, and a contact plug 52.

The power supply line can be arranged even in the lateral direction using the bridge line 45. The power supply line 4 can be omitted from the right side of a photodiode PD2-1 to arrange the ground line 5 on the right side in the longitudinal direction. The ground line 5 is formed from a second-layer aluminum line to provide a well contact in the pixel region.

The ground line 5 supplies the ground potential from the outside of the pixel region, and fixes the p-type well of the pixel region to the ground potential through a via plug 57, contact plug 58, polysilicon region 55, and shared contact 56. The method of the fifth embodiment can ensure a maximum of one ground of a well in a pixel for 2×4=8 or more pixels. However, the number of grounds may also be greatly decreased to, for example, one for 100×100=10,000 pixels.

On the left side of the photodiode PD2-1, that is, the right side of a photodiode PD1-1, a signal line 2 is shifted rightward to balance the columns of the photodiodes PD2-1 and PD1-1. This equalizes the quantities of light entering the columns of the photodiodes PD2-1 and PD1-1.

The fifth embodiment can decrease the number of second-layer aluminum lines to 1.5 for each pixel column while grounding the well of the pixel region. Compared to a conventional pixel region where ground lines are arranged, the fifth embodiment can widen an opening defined by a metal wiring layer, reducing color mixture caused by divergent diffracted light and increasing sensitivity.

The photoelectric conversion device according to the present invention is available as an image sensing device for a still camera, video camera, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-172624, filed Jul. 1, 2008, which is hereby incorporated by reference herein in its entirety.

What is claimed is:

1. A photoelectric conversion device in which at least a first metal wiring layer and a second metal wiring layer are arranged on a semiconductor substrate, the first metal wiring layer being arranged between the semiconductor substrate and a plane in which the second metal wiring layer is arranged, the semiconductor substrate comprising a pixel region where a plurality of pixels are arrayed to form rows and columns, each pixel including at least a photoelectric conversion portion, amplification transistors being provided for all of the columns so as to output signals of the pixels, the photoelectric conversion device being configured such that light is incident on the photoelectric conversion portions from an upper side of the second metal wiring layer, wherein the second metal wiring layer includes power supply lines extending along the columns, each of the power supply lines being configured to supply a power supply voltage to the amplification transistors of pixels in each of at least two columns, and wherein the amplification transistors of pixels in at least one of the at least two columns receive the power supply voltage, via a line included in the first metal wiring layer, from the power supply line that is provided for the at least two columns.

2. The device according to claim 1, wherein one of the power supply lines of the second metal wiring layer is arranged for either of two pixel columns and four pixel columns.

3. The device according to claim 1, wherein a ground line of the second metal wiring layer is arranged for a pixel column having no power supply line to contact a well in the pixel region.

4. The device according to claim 1, wherein each of the amplification transistors amplifies signals of a plurality of pixels.

5. The device according to claim 1, wherein the second metal wiring layer includes a signal line configured to read out a signal from the amplification transistors, an end portion of each of the pixels is arranged between the power supply line and the signal line on a pixel column having the power supply line, and the end portion of each of the pixels is arranged in a region of the signal line on a pixel column having no power supply line.

6. The device according to claim 1, wherein each of the amplification transistors is shared by at least two of the pixels which are arranged in the same column but is not shared by the pixels which are arranged in columns different from each other.

* * * * *